United States Patent [19]
Doty

[11] Patent Number: 5,424,645
[45] Date of Patent: Jun. 13, 1995

[54] DOUBLY BROADBAND TRIPLE RESONANCE OR QUAD RESONANCE NMR PROBE CIRCUIT

[75] Inventor: F. David Doty, Columbia, S.C.
[73] Assignee: Doty Scientific, Inc., Columbia, S.C.
[21] Appl. No.: 154,847
[22] Filed: Nov. 18, 1993
[51] Int. Cl.$^6$ ............................................. G01R 33/30
[52] U.S. Cl. .................................... 324/318; 324/322
[58] Field of Search ............... 324/318, 322, 314, 313, 324/300; 128/653.5

[56] References Cited

U.S. PATENT DOCUMENTS

| | | | |
|---|---|---|---|
| 4,446,431 | 5/1984 | McKay | 324/318 |
| 4,456,882 | 6/1984 | Doty | 324/321 |
| 4,463,328 | 7/1984 | Doty | 324/318 |
| 4,710,719 | 12/1987 | Doty | 324/318 |
| 4,742,304 | 5/1988 | Schnall et al. | 324/318 |
| 4,792,759 | 12/1988 | Keren et al. | 324/322 |
| 4,916,398 | 5/1990 | Rath | 324/322 |
| 5,038,105 | 8/1991 | Codrington et al. | 324/318 |
| 5,107,217 | 4/1992 | Duerr | 324/322 |
| 5,162,739 | 11/1992 | Doty | 324/322 |
| 5,229,724 | 7/1993 | Zeiger | 324/322 |
| 5,243,289 | 9/1993 | Blum et al. | 324/322 |
| 5,262,633 | 10/1993 | Doty et al. | 324/321 |

FOREIGN PATENT DOCUMENTS

| | | |
|---|---|---|
| 3634030 | 4/1988 | Germany . |
| 60-57278 | 4/1985 | Japan . |
| 9208146 | 5/1992 | WIPO . |
| 9215023 | 9/1992 | WIPO . |

OTHER PUBLICATIONS

Doty et al. J. Mag. Res 43 (1981) pp. 399–416.
Doty et al. J. Mag. Res 77 (May 1988) p. 536–549.
Garbow et al. J. Am. Chem. Soc. 115 (1993) p. 238.
Kuhns J. Mag. Res. 78 (Aug. 1988) pp. 69–76.
J. Tropp et al. 11 Mag. Res. in Medicine 405–412 *A Dual-Tuned Probe etc.* (Sep. 1989).
J. Murphy-Boesch et al. 2 Soc. Mag. Res. in Medicine 863 *Electrically Balanced Double-Tuned Surface Coils etc.* (Aug. 1988).

*Primary Examiner*—Sandra L. O'Shea
*Assistant Examiner*—Raymond Y. Mah
*Attorney, Agent, or Firm*—Oppedahl & Larson

[57] ABSTRACT

A single NMR sample coil of inductance $L_S$, in series with a mid-frequency (MF) tuning inductor grounded at one end, is doubly broadbanded using a first high-voltage broadband capacitor matching network in series with the two coils for the LF tuning and a second high-voltage broadband capacitor matching network connected to the junction between the two coils for the MF tuning. Isolation between the MF and LF ports is achieved by proper choice of a plug-in isolation capacitor between the two broadband matching networks. An inductively coupled floating HF tank circuit is inserted in series with one of the leads from the sample coil to produce the triple resonance circuit. The tuning elements for this HF tank are mounted on top of the adjacent broadband matching network. A second floating HF tank circuit may be inserted in series with the other lead from the sample coil to produce a balanced-HF triple resonance circuit or an unbalanced quad-resonance circuit. The tuning elements for the second HF tank circuit are mounted on top of the other broadband matching network. The inductors used in the HF tank or tanks each have inductance less than $L_S$. The MF tuning inductor has inductance greater than $L_S/4$ but less than $2L_S$.

26 Claims, 4 Drawing Sheets

DOUBLY BROADBAND TRIPLE RESONANCE OR QUAD RESONANCE NMR PROBE CIRCUIT

FIELD OF THE INVENTION

The field of this invention is the measurement of nuclear magnetic resonance (NMR) for the purpose of determining molecular or microscopic structure, and, more particularly, a multi-resonant circuit for NMR measurements requiring simultaneous high-power excitation at more than two frequencies.

BACKGROUND OF THE INVENTION

The NMR spectroscopist often finds it necessary to observe a wide variety of nuclides, especially $^{13}C$, $^{1}H$, $^{19}F$, $^{27}Al$, $^{29}Si$, $^{2}H$, and $^{15}N$ in the study of commercially and scientifically important chemicals. There have been numerous applications for double resonance circuits for the past three decades. The most common application is irradiating at the proton ($^{1}H$) high frequency (HF) resonance to decouple its dipolar broadening effects while observing Bloch decays on a nuclide of lower magnetogyric ratio such as $^{13}C$ at a low frequency (LF). Other examples include cross-polarization and inverse detection. Broadband (multinuclear) circuits as shown in FIG. 1 have provided multinuclear tuning capability on both channels so that cross polarization could be performed between any two of a large number of different nuclides.

For experiments on solid samples at high static magnetic field $B_0$ (greater than 6 T), where large RF fields $B_1$ are required (greater than 0.6 mT), typical voltages across the sample coil are 2 to 6 kV. In F. D. Doty, T. J. Connick, X. Z. Ni, and M. N. Clingan, *J. Mag. Res.* 77, "Noise in High Power, High Frequency Double Tuned Probes," 536 (1988), the authors discuss the various requirements for a high-performance, high-field, double-tuned solids probe for NMR. In U.S. Pat. No. 5,162,739, I disclose an efficient method of balancing a double-tuned high-power circuit so that proton $B_1$ can exceed 2 mT at 400 MHz with 0.3 ml samples in a Cross Polarization Magic Angle Spinning (CPMAS) probe that is broadbanded on the LF channel and uses a sample spinner such as the one described in U.S. Pat No. 5,202,633.

It has sometimes been useful to be able to perform CP experiments pair-wise between three or four nuclides under MAS conditions, where it is difficult to use orthogonal sample coils. Fixed-frequency triple-resonance and quad-resonance single-sample-coil circuits suitable for high-power NMR experiments have been commercially available for eight years. Most have been similar to the triple-resonance circuit shown in FIG. 2, which can be extended with another inductor and set of tuning elements to quad-resonance. The trap-matrix approach of Schnall et al, U.S. Pat. No. 4,742,304, is effective when sample losses dominate other loss mechanisms, as in many MRI situations. The method of McKay, U.S. Pat. No. 4,446,431, using transmission line sections, generally results in degraded transient response for solids applications but it provides more flexibility in the selection of variable capacitors. McKay's method has also been extended to triple and quad-resonance, and others have applied it to MRI applications.

Recently, several new triple-resonance techniques have been developed that have considerable value in determining internuclear distances to a high level of precision in complex molecules. One such technique, that has (oddly) been referred to as Rotational Echo Double Resonance (REDOR), is described in "Determination of the Molecular Conformation of Melanostatin Using $^{13}C$-$^{15}N$-REDOR NMR Spectroscopy," by J. R. Garbow and C. A. McWherter, in the *Journal of the American Chemical Society*, p. 238, 1993. The REDOR technique appears to have considerable value in drug design and other biochemical analytical applications. This technique requires a triple resonance circuit in which the HF channel is tuned for $^{1}H$ decoupling and the LF and mid-frequency (MF) channels are tuned to the respective frequencies of two other nuclides whose internuclear distance is to be determined—for example, $^{13}C$-$^{15}N$, $^{31}P$-$^{23}Na$, $^{31}P$-$^{15}N$ etc. Hence, it is desirable to provide a triple resonance circuit that is broadbanded at both the LF and MF frequencies.

The difficulties involved in simultaneously achieving high efficiency, adequate channel isolation, simple tune-up, and high power capability in a triple resonance circuit within the constraints of a typical NMR magnet have heretofore prevented the realization of a doubly broadband triple-resonance single-sample-coil NMR circuit by any combination of the prior art, as will be described.

Many factors conspire against the would-be designer of an NMR probe. A workable NMR probe has to fit in the close confines of the magnet being used; it has to be mechanically robust in the face of gravitational and magnetic forces, ruling out many materials from which it might otherwise be constructed; its components must tolerate the high voltages and strong RF fields that are present; and stray inductances and capacitances have to be controlled.

While any NMR probe design is difficult, a doubly broadband triple or quad resonance NMR probe circuit is particularly difficult. While a schematic design is easy to develop which would theoretically satisfy the probe functional needs, many schematic designs turn out to be impractical physically. For example, some of the tuning capacitors used in probes are physically large and require substantial mounting arrangements. If one end of a capacitor is to be grounded, the grounded connection can be a mechanical connection as well, providing the mounting means for the capacitor. But if neither end is to be grounded, some way must be found to mount the capacitor in an insulated fashion. If both ends of the capacitor are to be at high voltage (and if the capacitor is a large one) then it is quite difficult to work out a way to mount the capacitor robustly.

While it is an easy matter to rule out various proposed circuit schematics due to the inability of their actual construction in a workable probe, it is no easy matter to arrive at a circuit schematic that can actually be built, will fit within the space allowed, and will work. The key concepts disclosed herein enabling the doubly broadband triple resonance circuit are also applicable to doubly-broadband quad-resonance circuits for NMR techniques requiring four high-power channels.

SUMMARY OF THE INVENTION

A single NMR sample coil of inductance $L_S$, in series with a mid-frequency (MF) tuning inductor grounded at one end, may be doubly broadbanded using a first high-voltage broadband capacitor matching network in series with the two coils for the LF tuning and a second high-voltage broadband capacitor matching network connected to the junction between the two coils for the MF tuning. Isolation between the MF and LF ports is achieved by proper choice of a plug-in isolation capacitor between the two broadband matching networks. An inductively coupled floating HF tank circuit is inserted in series with one of the leads from the sample coil to produce the triple resonance circuit. The tuning elements for this HF tank are physically mounted on top of the adjacent broadband matching network. A second floating HF tank circuit may be inserted in series with the other lead from the sample coil to produce a balanced-HF triple resonance circuit or an unbalanced quad-resonance circuit. The tuning elements for the second HF tank circuit may be physically mounted on top of the other broadband matching network. The inductors used in the HF tanks each have inductance less than $L_S$. The MF tuning inductor has inductance greater than $L_S/4$ but less than $2L_S$.

BRIEF DESCRIPTION OF THE DRAWING

The invention will be described with respect to a drawing in several figures, of which.

Where possible, like elements have been denoted with like reference numerals in the various figures.

DETAILED DESCRIPTION OF AN EXEMPLARY EMBODIMENT

Figure 1:
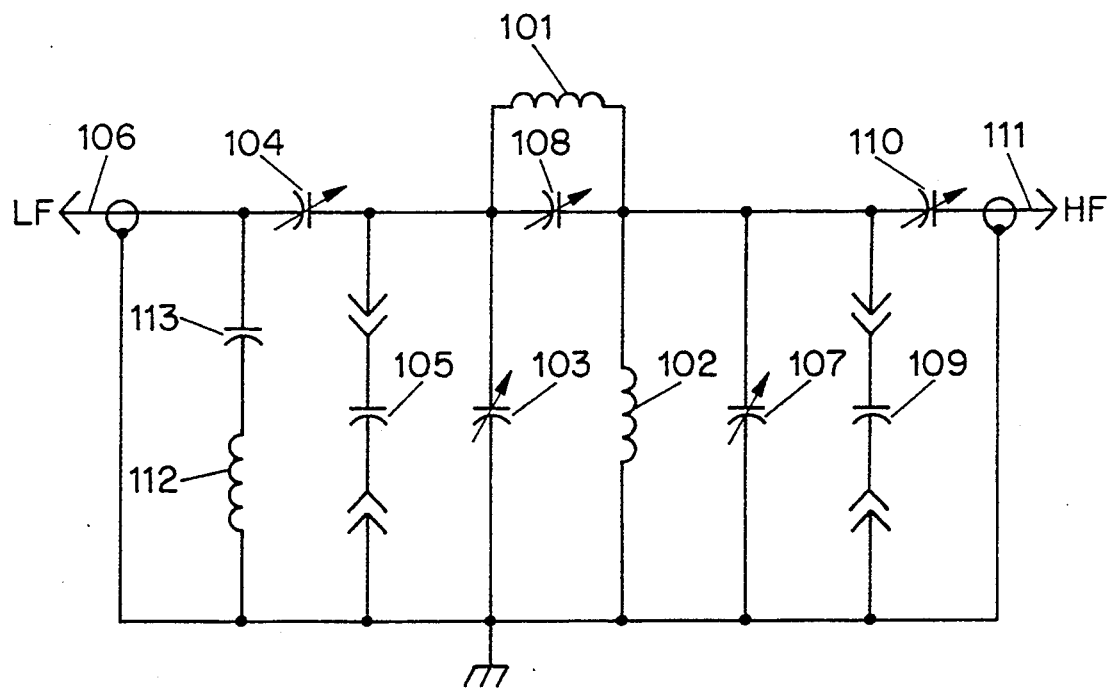
FIG. 1 depicts a prior art doubly broadband, double-resonance, high-field, solids NMR probe circuit.

FIG. 1 illustrates the prior art high-power, doubly broadband, double-tuned, high-field solids NMR probe circuit less parasitic elements in its simplest form. It is basically equivalent to FIG. 1 of U.S. Pat. No. 5,162,739 except that (1) capacitive voltage division is not employed, (2) the HF channel is broadbanded, and (3) the parasitic elements are not shown. An approximate analysis of a similar circuit may be found in "A Multinuclear Double Tuned Probe for Applications with Solids or Liquids Using Lumped Elements," by F. D. Doty, R. R. Inners, and P. D. Ellis in *J. Magnetic Resonance* 43, p. 399 (1981).

In this prior-art circuit, sample coil $L_S$ 101 is connected in series with the HF tuning inductor $L_2$ 102. The series mode is tuned primarily by variable capacitor 103 and plug-in capacitor 105 to the LF. It is matched to the 50-Ω LF port 106 by variable capacitor 104. The parallel mode is tuned primarily by variable capacitors 107, 108 and plug-in capacitor 109 to the HF. It is matched to the 50-Ω HF port 111 by variable capacitor 110. Variable capacitor 108 tunes the sample coil to a high parallel impedance at the HF to achieve high isolation between the ports at the HF. LF isolation comes from the high-pass nature of the HF matching network. It is sometimes necessary to increase HF isolation with an additional trap at the LF port using inductor 112 and capacitor 113 series-tuned to the HF.

The lead lengths required to accommodate variable temperature, multinuclear, and MAS capability add typically 12 nH to 20 nH in series with each lead of the sample coil, and typically 5 nH parasitic inductance is associated with each capacitor. Optimum sample coil inductance $L_S$ is typically 50 to 150 nH, and optimum HF tuning coil 102 has typical inductance $L_S/3$. The HF tuning coil 102 is often a shorted section of a coaxial transmission line of length less than $\frac{1}{4}$ wavelength.

Figure 2:
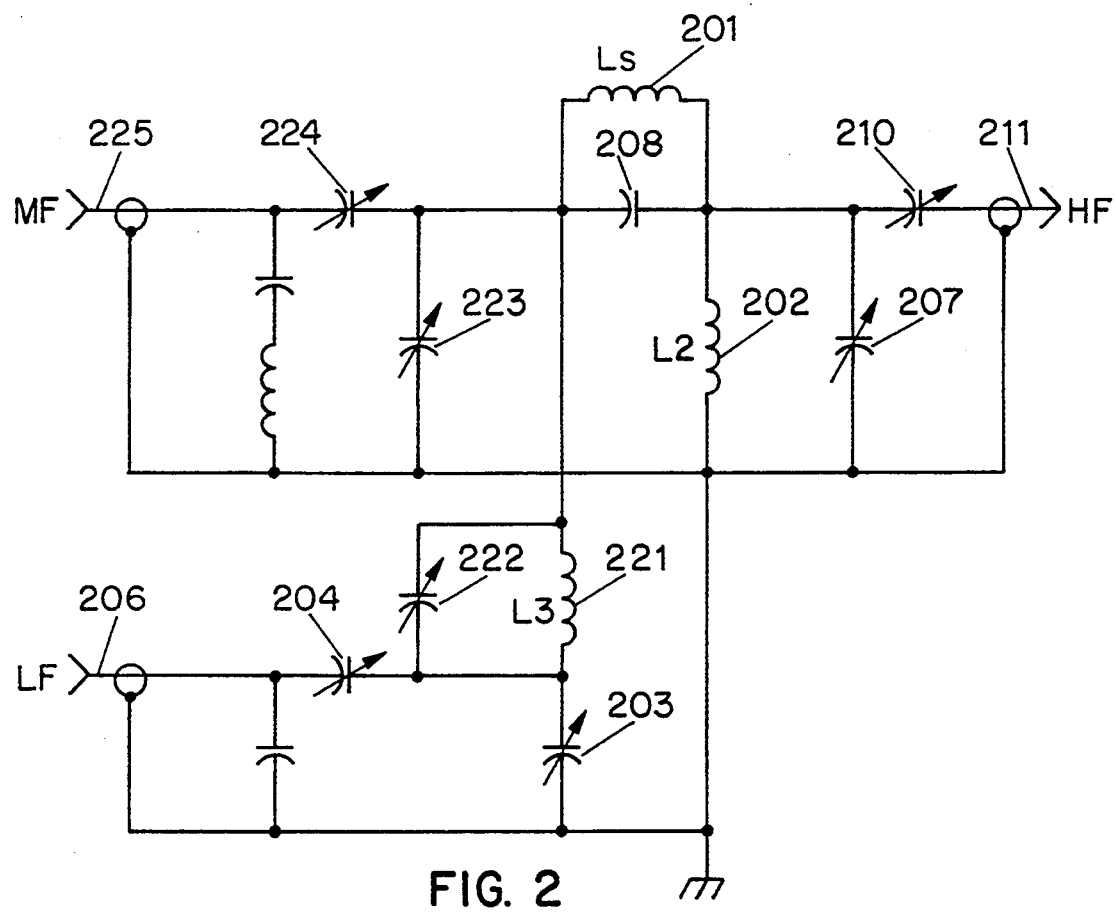
FIG. 2 shows a prior art fixed-frequency, triple-resonance, high-field, solids NMR probe circuit.

FIG. 2 illustrates the most common triple resonance circuit of the prior art in its simplest form. The sample coil $L_S$ 201 is connected in series with the HF tuning inductor $L_2$ 202. The series mode is tuned primarily by variable capacitor 203 to the LF frequency. It is matched to the 50-Ω LF port 206 by variable capacitor 204. The HF mode ($L_S$ and L2 effectively in parallel) is tuned primarily by variable capacitor 207. It is matched to the 50-Ω HF port 211 by variable capacitor 210. Fixed capacitor 208 tunes the sample coil to a high parallel impedance at the HF to achieve high isolation between the ports at the HF. LF tuning coil L3 221 is tuned to a high impedance at the MF with variable capacitor 222 to achieve high isolation between the MF and LF ports at MF. The MF mode (L3 effectively in parallel with the series combination of $L_S$ and L2) is tuned primarily with variable capacitor 223. It is matched to the 50-Ω MF port 225 by variable capacitor 224. LF isolation comes from the high-pass nature of the HF and MF matching networks. It is sometimes necessary to increase HF isolation with additional traps or filters at the LF and MF ports.

Again, lead inductance will add 10 to 20 nH in series with each lead of each coil. Optimum sample coil inductance $L_S$ is typically 60 to 180 nH for this arrangement. The variable capacitors are usually quartz dielectric types with rms RF voltage rating of 1.7 kV and adjustment range of 1 to 10 pF. Since higher voltages are often required, capacitive voltage division is normally employed (as shown in FIG. 1 of U.S. Pat No. 5,162,739) and the tuning range is severely limited. To make this circuit broadbanded, the LF and MF channels must use large variable capacitors of the sealed-bellows high-pressure-gas type or vacuum type, with rms RF voltage rating above 2.5 kV and typical adjustment range of 2 to 45 pF. Alternatively, smaller quartz variable capacitors and plug-in capacitive voltage division, as described in U.S. Pat No. 4,710,719, could be used. The topology of FIG. 2 does not lend itself well to the use of large variable capacitors or plug-in capacitive voltage division without substantial increases in parasitic lead inductances, which adversely affect tuning range, isolation, and efficiency. For example, capacitor 222 has high voltage at both ends, and so it is difficult to find a way to mount it robustly and to satisfy its circuit connection requirements.

Figure 3:
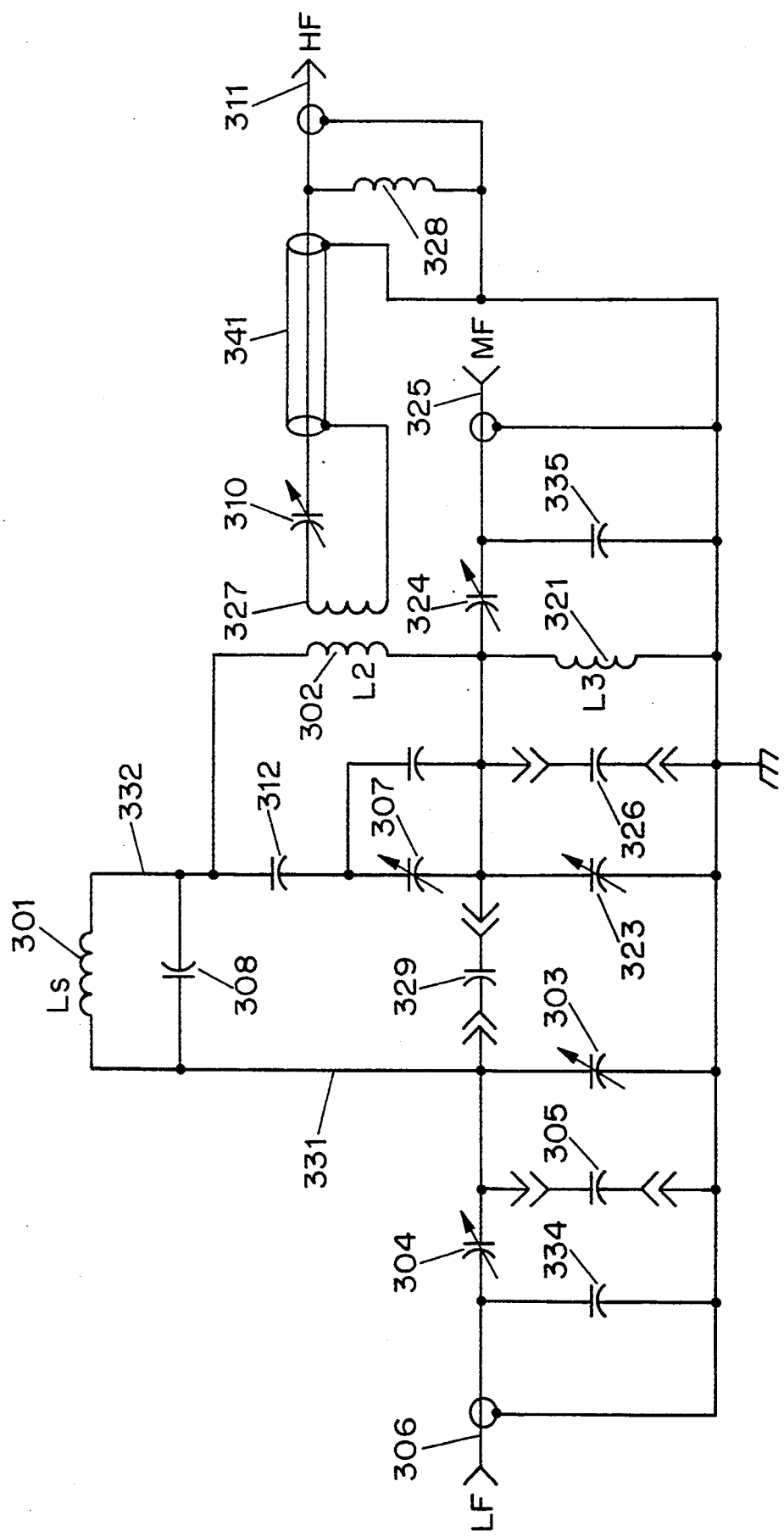
FIG. 3 is a schematic diagram of a doubly broadband, triple-resonance, high-field solids NMR circuit according to the invention.
Figure 4:
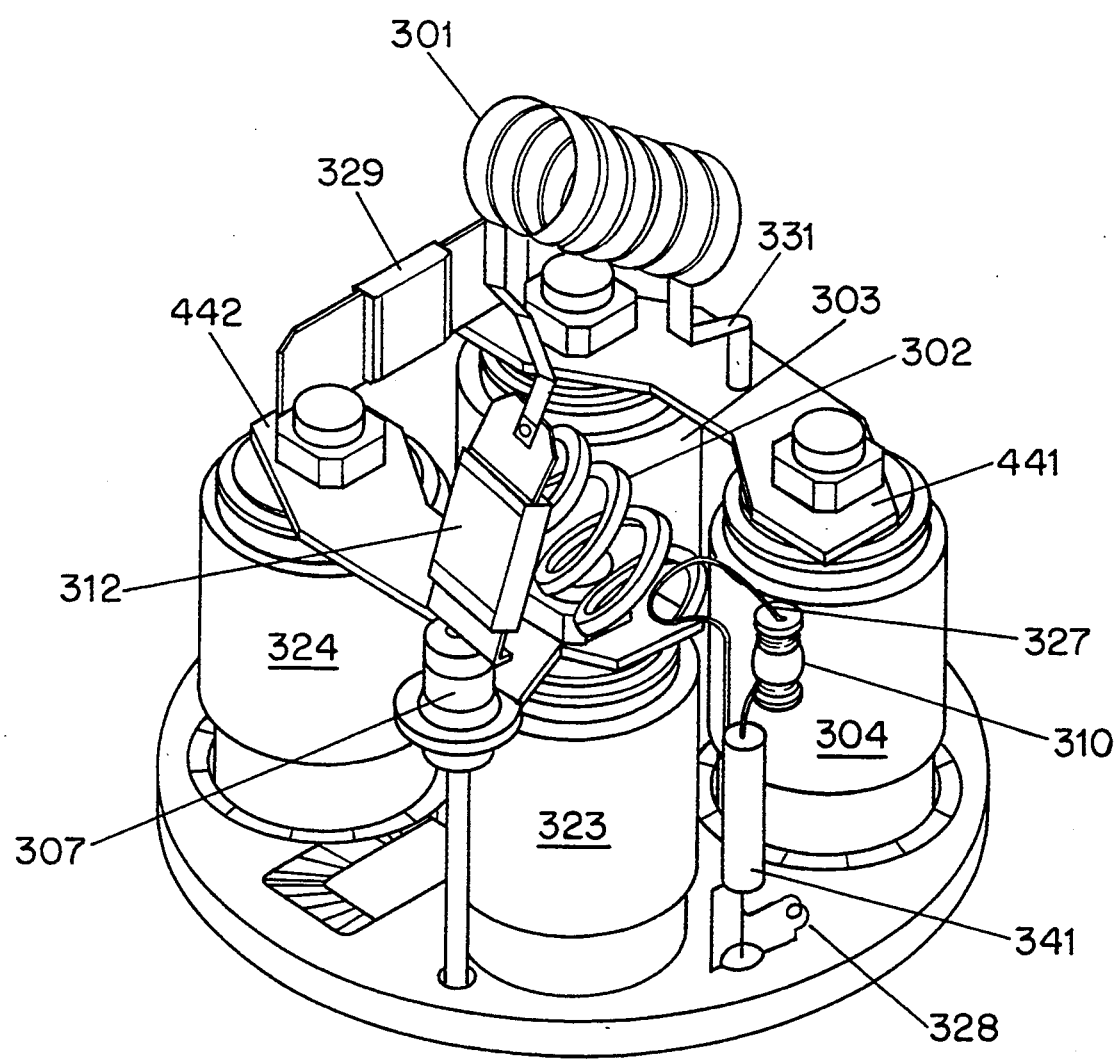
FIG. 4 is a perspective mechanical drawing showing an embodiment of the geometry of the circuit of FIG. 3 in accordance with the invention.

FIG. 3 schematically discloses the instant invention, which involves employing an inductively coupled floating HF tank in a multi-tuned circuit. The distinction over the prior art lies partially in the topology as shown in FIG. 4 for the typical MAS probe, in which the sample coil $L_S$ is oriented at 54.7° with respect to the external magnetic field. One lead of the sample coil $L_S$ is connected directly to the inductively coupled floating HF tuning network. This direct connection permits minimum parasitic lead inductance and stray capacitance as required for high efficiency and broadband tuning. Parasitic lead inductances are typically reduced to less than 5 nH each.

In the preferred triple resonance circuit of FIG. 3, sample coil $L_S$ 301, typically 40–100 nH, has a first lead 331 connected to an LF tuning network and a second lead 332 connected through an HF tuning network to an MF tuning network. This configuration permits minimal length connections, simplified tuning, and excellent channel isolation. Alternatively, the HF tuning network could be on the other side, so that the first lead 331 is connected through the HF tuning network to the LF tuning network and the second lead 332 is connected directly to the MF tuning network. Another alternative is the quad-resonance circuit disclosed later in FIG. 5, with a first HF tuning network in series with the first lead and a second HF tuning network in series with the second lead.

Returning now to the triple resonance circuit of FIGS. 3 and 4, the series mode is tuned to the LF with high-voltage (HV) variable capacitor 303 and plug-in capacitor 305. It is matched to 50 Ω with HV variable capacitor 304. Broadband tuning and matching of the LF is typically accomplished by the use of 2-45 pF, 2.5 kV rms, high-pressure-gas-filled variable capacitors. Lead 331 is attached to connecting strap 441 between the LF tuning capacitor 303 and the LF matching capacitor 304. Broadband tuning and matching of the MF is also typically accomplished by the use of high-pressure-gas-filled variable capacitors in the MF tuning circuit along with coil L3 321 and plug-in capacitor 326. The connecting strap 442 between the MF tuning capacitor 323 and the MF matching capacitor 324 provides a convenient platform on which to mount the HF tuning network. The HF tuning network, consisting of coil L2 302 and tuning variable capacitor 307 with associated voltage division capacitor 312 is isolated from ground through coupling loop 327 and matched to 50 Ω via capacitor 310. Since the HF channel is intended to operate at a fixed frequency, it requires only small adjustments which are best handled with small variable capacitors and appropriate voltage division. The coupling loop 327 will normally be a single turn to reduce voltages and standing wave ratio (SWR) in the short transmission line 341 that traverses the distance from the HF coupling loop to the ground plane.

With reference to FIGS. 3 and 4, it will be appreciated that coil L2 302, connected as it is to two high-voltage portions of the circuit, defines what may thus be termed a "floating coil". One aspect of the invention, then, follows from the insight, obvious in retrospect, that in an NMR probe with its many design constraints a floating coil is easier to mount than a floating capacitor would be.

LF and MF isolation at the HF port is achieved from the high-pass nature of the HF matching network and may be augmented with an additional shunt coil 328. MF isolation at the LF port is accomplished with proper selection of capacitor 329 to tune the series combination of $L_S$ and L2 (and associated capacitors and leads) to a high parallel impedance at MF. HF isolation at the LF port is accomplished by proper selection of the $L_S$ tuning capacitor 308. HF filter capacitors 334, 335 enhance HF isolation at the LF and MF ports respectively. Capacitor 329 is desirably capable of being unplugged and replaced by connectors omitted for clarity in FIG. 4.

High efficiencies at the LF and MF are usually more important than high efficiency at the HF, but HF efficiency is also moderately important. Thus, L2 is typically between 25% and 70% of $L_S$. $L_S$ and L3 typically are comparable in value, although one may be as much as twice the other. L3 and $L_S$ would usually have high Q (greater than 150). L2 would usually have high Q, but it may sometimes be desirable to spoil its Q by plating with a poor conductor to facility multi-pulse experiments requiring rapid ringdown at the HF.

In narrow bore magnets, smaller quartz-dielectric variable capacitors with rms voltage rating of 1.7 kV and adjustment range of 1 to 10 pF may be used in place of the high-pressure-gas-filled variables along with capacitive voltage division. As in the prior art, L3 may be a short portion of a coaxial transmission line, but L2 must be a short solenoid to minimize stray capacitance for broadband capability on the MF and to minimize high voltage arcing problems at the MF. L2 will typically be a two-turn solenoid with length 70% of its diameter. The length-to-diameter ratio of L2 may be as small as 0.2 or as large as 2. L2 must have two, three, or four turns for high-field solids NMR circuits. The inductance of L2 will generally be less than 40 nH but always less than 100 nH.

When the prior art circuit of FIG. 2 was changed to that of FIG. 3 in a 300 MHz MAS probe with a 5 mm rotor, the maximum achievable proton $B_1$ increased from 1.6 mT to 2.2 mT, LF and MF efficiencies each increased by at least 10%, and multinuclear capability was obtained on both LF and MF channels without tuning or isolation difficulties. The circuit has also been shown to be extremely effective with HF as high as 500 MHz with MF and LF frequencies separated by as little as 10% of MF, whereas prior art triple resonance circuits have had serious difficulties with HF above 350 MHz even for more widely spaced resonances.

Those skilled in the art will appreciate, as mentioned above, that the HF circuitry of FIG. 3, attached to lead 332 of the sample coil, could just as well be attached to lead 331 of the sample coil, without in any way departing from the invention.

Figure 5:
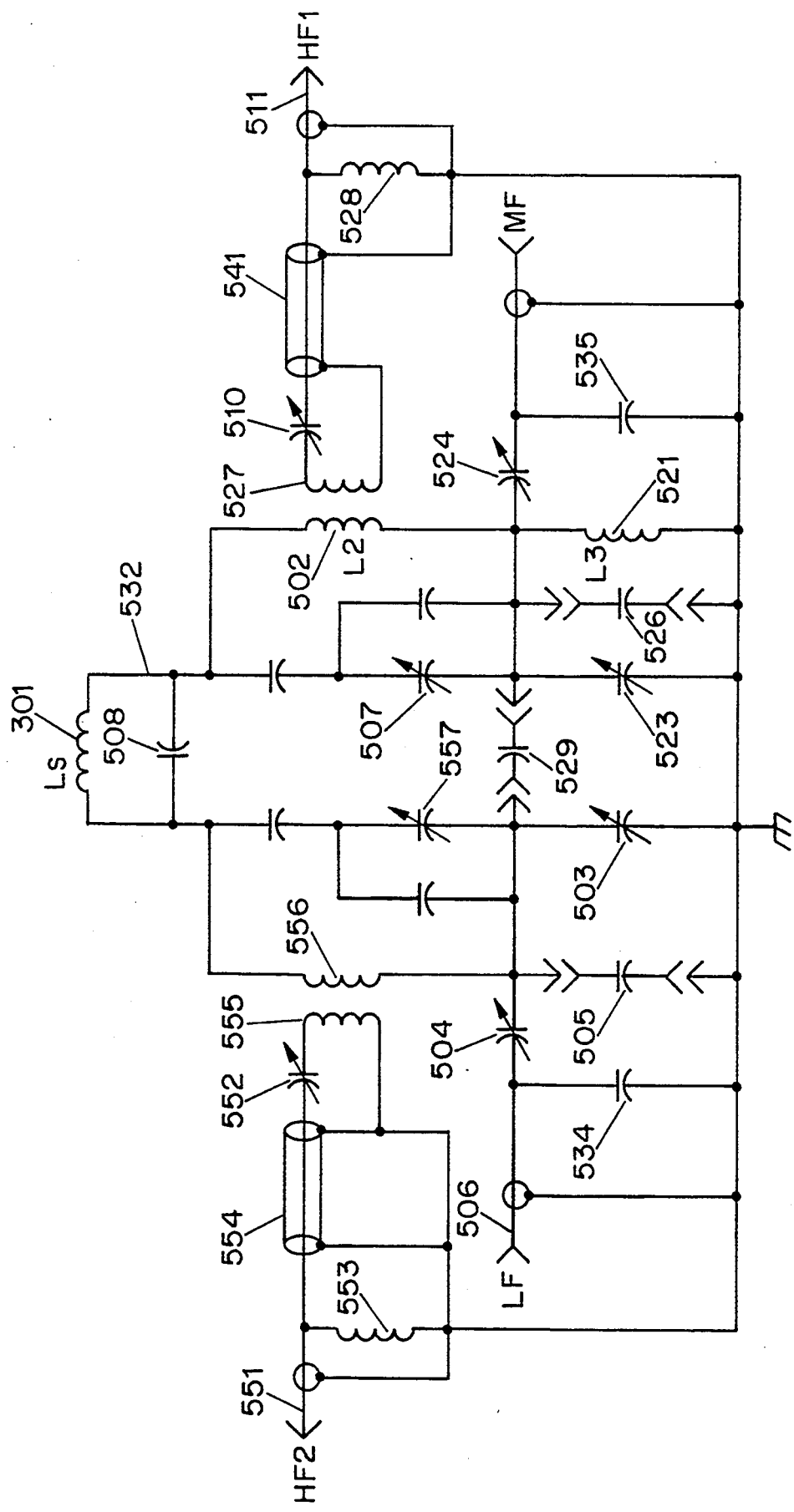
FIG. 5 is a schematic diagram of a doubly broadband, quad-resonance, high-field solids NMR circuit according to the invention.

FIG. 5 discloses a quad-resonance circuit obtained by adding a second inductively coupled floating HF tank circuit. All of the circuit components from FIG. 3 have counterparts in FIG. 5 having the same last two digits, where they serve the same function. The additional inductively coupled floating tank, composed of items 551, 552, 553, 554, 555, 556, 557, allows resonance at a second high frequency HF2. It will be appreciated that coil 556 corresponds to coil 502, coil 555 to coil 527, line 554 to line 541, capacitor 552 to capacitor 510, and inductor 553 to inductor 528.

If HF1 is equal to HF2 and less than 90% of the resonant frequency of $L_S$ and capacitor 308, the HF resonance will be split and the upper HF mode may be balanced for reduced dielectric losses, but the lower HF mode is no longer usable for NMR, as detailed in U.S. Pat No. 5,162,739.

The preceding discussion sets forth in great detail the circuit design, topology, and physical configuration of the low-, mid-, and high-frequency portions of an NMR probe. Those skilled in the art will appreciate that a functioning NMR probe also comprises a sample holder, means holding the sample holder within the excitation coil, and means holding the circuit and sample holder near the center of field of an external magnetic field. If the probe is to be used for magic angle spinning, then it is also necessary to have spinning means spinning a sample within the sample holder at a predetermined angle relative to the external magnetic field. One spinner arrangement is described in the aforementioned U.S. Pat. No. 5,202,633. Other aspects of probe structure may be seen in U.S. Pat. No. 4,456,882 to Doty, U.S. Pat. No. 4,463,328 to Doty, U.S. Pat. No. 4,710,719 to Doty, and U.S. Pat. No. 5,162,739 to Doty.

Although this invention has been described herein with reference to specific embodiments, it will be recognized that changes and modifications may be made without departing from the spirit of the present invention. All such modifications and changes are intended to be included within the scope of the following claims.

I claim:

1. A multi-tuned, broadband circuit for high-field solids NMR probes requiring a high-frequency port carrying a high frequency, a low-frequency port carrying a low frequency, and a mid-frequency port carrying a middle frequency, said multi-tuned circuit comprising:
   a sample excitation coil with a first lead at a first end and a second lead at a second end;
   a floating coil with a first lead and a second lead, said first lead of the floating coil connected to said second lead of said excitation coil;
   a high-frequency capacitive tuning network connected to said floating coil;
   a mid-frequency tuning inductor with a first lead and a grounded second lead, said first lead of the tuning inductor connected to said second lead of said floating coil;
   a mid-frequency capacitive tuning network connected to said first lead of said mid-frequency tuning inductor and connected with the mid-frequency port;
   an inductive coupling loop linking a portion of the flux of said floating coil and connected with the high frequency port;
   a low-frequency capacitive tuning network connected to said first lead of said excitation coil and connected with the low-frequency port.

2. The multi-tuned circuit of claim 1 wherein said floating coil is a multi-turn coil of fewer than six turns.

3. The multi-tuned circuit of claim 1 wherein said low-frequency capacitive tuning network comprises at least one high-pressure-gas-filled variable capacitor.

4. The multi-tuned circuit of claim 1 wherein said floating coil is further characterized in having length-to-diameter ratio greater than 0.2 and less than 2.0.

5. The multi-tuned circuit of claim 1 wherein the ratio of inductance of said excitation coil to that of said floating coil is approximately three.

6. The multi-tuned circuit of claim 1 above wherein said mid-frequency tuning inductor is further characterized by being a coaxial line of length approximately one fourth of the high frequency wavelength.

7. A multi-tuned, broadband circuit for high-field solids NMR probes requiring a high-frequency port carrying a high frequency, a low-frequency port carrying a low frequency, and a mid-frequency port carrying a mid-frequency, said multi-tuned circuit comprising:
   a sample excitation coil with a first lead at a first end and a second lead at a second end;
   a floating coil with a first lead and a second lead, said first lead of the floating coil connected to said first lead of said excitation coil;
   a high-frequency capacitive tuning network connected to said floating coil;
   a mid-frequency tuning inductor with a first lead and a grounded second lead, said first lead of the tuning inductor connected to said second lead of said excitation coil;
   a mid-frequency capacitive tuning network connected to said first lead of said mid-frequency tuning inductor and connected with the mid-frequency port;
   an inductive coupling loop linking a portion of the flux of said floating coil and connected with the high-frequency port;
   a low-frequency capacitive tuning network connected to said second lead of said floating coil and connected with the low-frequency port.

8. The multi-tuned circuit of claim 7 wherein said floating coil is a multi-turn coil of fewer than six turns.

9. The multi-tuned circuit of claim 7 wherein said low-frequency capacitive tuning network comprises at least one high-pressure-gas-filled variable capacitor.

10. The multi-tuned circuit of claim 7 wherein said floating coil is further characterized in having length-to-diameter ratio greater than 0.2 and less than 2.0.

11. The multi-tuned circuit of claim 7 wherein the ratio of inductance of said excitation coil to that of said floating coil is approximately three.

12. The multi-tuned circuit of claim 7 above wherein said mid-frequency tuning inductor is further characterized by being a coaxial line of length approximately one fourth of the high frequency wavelength.

13. An NMR probe comprising a multi-tuned, broadband circuit having a high-frequency port carrying a high frequency, a low-frequency port carrying a low frequency, and a mid-frequency port carrying a middle frequency, said multi-tuned circuit comprising:
   a sample excitation coil with a first lead at a first end and a second lead at a second end;
   a floating coil with a first lead and a second lead, said first lead of the floating coil connected to said second lead of said excitation coil;
   a high-frequency capacitive tuning network connected to said floating coil;
   a mid-frequency tuning inductor with a first lead and a grounded second lead, said first lead of the tuning inductor connected to said second lead of said floating coil;
   a mid-frequency capacitive tuning network connected to said first lead of said mid-frequency tuning inductor and connected with the mid-frequency port;
   an inductive coupling loop linking a portion of the flux of said floating coil and connected with the high frequency port;
   a low-frequency capacitive tuning network connected to said first lead of said excitation coil and connected with the low-frequency port;
   the probe further comprising a sample holder, means holding the sample holder within the excitation coil, and means holding the circuit and sample holder near the center of field of an external magnetic field.

14. The NMR probe of claim 13 wherein said floating coil is a multi-turn coil of fewer than six turns.

15. The NMR probe of claim 13 wherein said low-frequency capacitive tuning network comprises at least one high-pressure-gas-filled variable capacitor.

16. The NMR probe of claim 13 wherein said floating coil is further characterized in having length-to-diameter ratio greater than 0.2 and less than 2.0.

17. The NMR probe of claim 13 wherein the ratio of inductance of said excitation coil to that of said floating coil is approximately three.

18. The NMR probe of claim 13 above wherein said mid-frequency tuning inductor is further characterized by being a coaxial line of length approximately one fourth of the high frequency wavelength.

19. The NMR probe of claim 13 further comprising spinning means spinning a sample within the sample holder at a predetermined angle relative to the external magnetic field.

20. An NMR probe comprising a multi-tuned, broadband circuit having a high-frequency port carrying a high frequency, a low-frequency port carrying a low frequency, and a mid-frequency port carrying a mid-frequency, said multi-tuned circuit comprising:

a sample excitation coil with a first lead at a first end and a second lead at a second end;

a floating coil with a first lead and a second lead, said first lead of the floating coil connected to said first lead of said excitation coil;

a high-frequency capacitive tuning network connected to said floating coil;

a mid-frequency tuning inductor with a first lead and a grounded second lead, said first lead of the tuning inductor connected to said second lead of said excitation coil;

a mid-frequency capacitive tuning network connected to said first lead of said mid-frequency tuning inductor and connected with the mid-frequency port;

an inductive coupling loop linking a portion of the flux of said floating coil and connected with the high-frequency port;

a low-frequency capacitive tuning network connected to said second lead of said floating coil and connected with the low-frequency port;

the probe further comprising a sample holder, means holding the sample holder within the excitation coil, and means holding the circuit and sample holder near the center of field of an external magnetic field.

21. The NMR probe of claim 20 wherein said floating coil is a multi-turn coil of fewer than six turns.

22. The NMR probe of claim 20 wherein said low-frequency capacitive tuning network comprises at least one high-pressure-gas-filled variable capacitor.

23. The NMR probe of claim 20 wherein said floating coil is further characterized in having length-to-diameter ratio greater than 0.2 and less than 2.0.

24. The NMR probe of claim 20 wherein the ratio of inductance of said excitation coil to that of said floating coil is approximately three.

25. The NMR probe of claim 20 above wherein said mid-frequency tuning inductor is further characterized by being a coaxial line of length approximately one fourth of the high frequency wavelength.

26. The NMR probe of claim 20 further comprising spinning means spinning a sample within the sample holder at a predetermined angle relative to the external magnetic field.

* * * * *